(12) United States Patent
van der Straten et al.

(10) Patent No.: US 12,444,682 B2
(45) Date of Patent: Oct. 14, 2025

(54) LOCALLY WIDENED PROFILE FOR NANOSCALE WIRING STRUCTURE

(71) Applicant: INTERNATIONAL BUSINESS MACHINES CORPORATION, Armonk, NY (US)

(72) Inventors: Oscar van der Straten, Guilderland Center, NY (US); Koichi Motoyama, Clifton Park, NY (US); Scott A. DeVries, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 17/955,803

(22) Filed: Sep. 29, 2022

(65) Prior Publication Data

US 2024/0113018 A1 Apr. 4, 2024

(51) Int. Cl.
*H01L 23/528* (2006.01)
*H01L 21/768* (2006.01)
*H01L 23/532* (2006.01)

(52) U.S. Cl.
CPC .... *H01L 23/5283* (2013.01); *H01L 21/76816* (2013.01); *H01L 21/76877* (2013.01); *H01L 23/53266* (2013.01)

(58) Field of Classification Search
CPC ........... H01L 23/5283; H01L 21/76816; H01L 21/76877; H01L 23/53266; H01L 23/5226; H01L 23/528; H01L 21/76885
See application file for complete search history.

(56) References Cited

U.S. PATENT DOCUMENTS

| | | | |
|---|---|---|---|
| 9,418,889 B2 | 8/2016 | Mountsier et al. | |
| 9,613,853 B2 | 4/2017 | Chen et al. | |
| 10,157,777 B2 | 12/2018 | He et al. | |
| 10,297,580 B2 | 5/2019 | Bach et al. | |
| 10,957,769 B2 | 3/2021 | Ma et al. | |
| 11,107,731 B1 * | 8/2021 | Xie | H01L 23/5226 |
| 11,164,780 B2 | 11/2021 | You et al. | |

(Continued)

FOREIGN PATENT DOCUMENTS

WO 2021046212 A1 3/2021

OTHER PUBLICATIONS

Zhang et al., "Mechanical Stability of Air-gap Interconnects," Back End of Line, Printed Sep. 14, 2022, 8 pages, http://citeseerx.ist.psu.edu/viewdoc/download?doi=10.1.1.353.8557&rep=rep1&type=pdf.

*Primary Examiner* — Karen Kusumakar
(74) *Attorney, Agent, or Firm* — Matthew Zehrer

(57) ABSTRACT

A wire interconnect, a wire interconnect structure, and a method to form wire interconnect structures with locally widened profiles. The wire interconnect may include a first portion of the wire interconnect with a first width. The wire interconnect may also include a second portion of the wire interconnect with a second width, where the second width is greater than the first width, and where the second portion of the wire interconnect is above the first portion of the wire interconnect. The wire interconnect may also include a third portion of the wire interconnect with a third width, where the third width is less than the second width, and where the third portion of the wire interconnect is above the second portion of the wire interconnect.

19 Claims, 16 Drawing Sheets

(56) References Cited

U.S. PATENT DOCUMENTS

| | | | |
|---|---|---|---|
| 2016/0049330 A1* | 2/2016 | Peng | H01L 21/76885 |
| | | | 257/774 |
| 2021/0202479 A1 | 7/2021 | Naskar et al. | |
| 2021/0296229 A1* | 9/2021 | Park | H01L 23/5226 |
| 2021/0375671 A1* | 12/2021 | Reznicek | H01L 21/76877 |
| 2022/0157725 A1* | 5/2022 | Gupta | H01L 23/535 |
| 2022/0165941 A1* | 5/2022 | Mather | G01R 33/098 |

* cited by examiner

LOCALLY WIDENED PROFILE FOR NANOSCALE WIRING STRUCTURE

BACKGROUND

The present disclosure relates to wiring structures in integrated circuits and logic devices and, more specifically, to forming wire structures with locally widened profiles to increase uniformity between wires.

Semiconductor devices, also referred to as semiconductor chips, are widely used in electronics, machines, etc. They consist of a various components (such as substrates/wafers, transistors, etc.) and may form electronic circuits (such as integrated circuits, etc.). Interconnects are often used within the semiconductor device to connect the various components of the chip/circuit. These interconnects may also be referred to herein as wires and/or wiring.

SUMMARY

The present invention provides a wire interconnect, a wire interconnect structure, and a method to form wire interconnect structures with locally widened profiles. The wire interconnect may include a first portion of the wire interconnect with a first width. The wire interconnect may also include a second portion of the wire interconnect with a second width, where the second width is greater than the first width, and where the second portion of the wire interconnect is above the first portion of the wire interconnect. The wire interconnect may also include a third portion of the wire interconnect with a third width, where the third width is less than the second width, and where the third portion of the wire interconnect is above the second portion of the wire interconnect.

The wire interconnect structure may include a wire interconnect. The wire interconnect may include a first portion of the wire interconnect with a first width. The wire interconnect may also include a second portion of the wire interconnect with a second width, where the second width is greater than the first width, and where the second portion of the wire interconnect is above the first portion of the wire interconnect. The wire interconnect may also include a third portion of the wire interconnect with a third width, where the third width is less than the second width, and where the third portion of the wire interconnect is above the second portion of the wire interconnect. The wire interconnect structure may also include one or more dielectrics.

The method of forming a wire interconnect structure may include depositing one or more dielectrics. The method may also include forming a first opening in the one or more dielectrics, where the first opening has a first width. The method may also include forming a second opening in the one or more dielectrics, where the second opening has a second width and where the second opening is above the first opening. The method may also include locally widening a portion of the second opening, where the locally widened portion has a third width, the third width greater than the first width and the second width. The method may also include depositing conductive material in the first opening, the second opening, and the locally widened portion.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
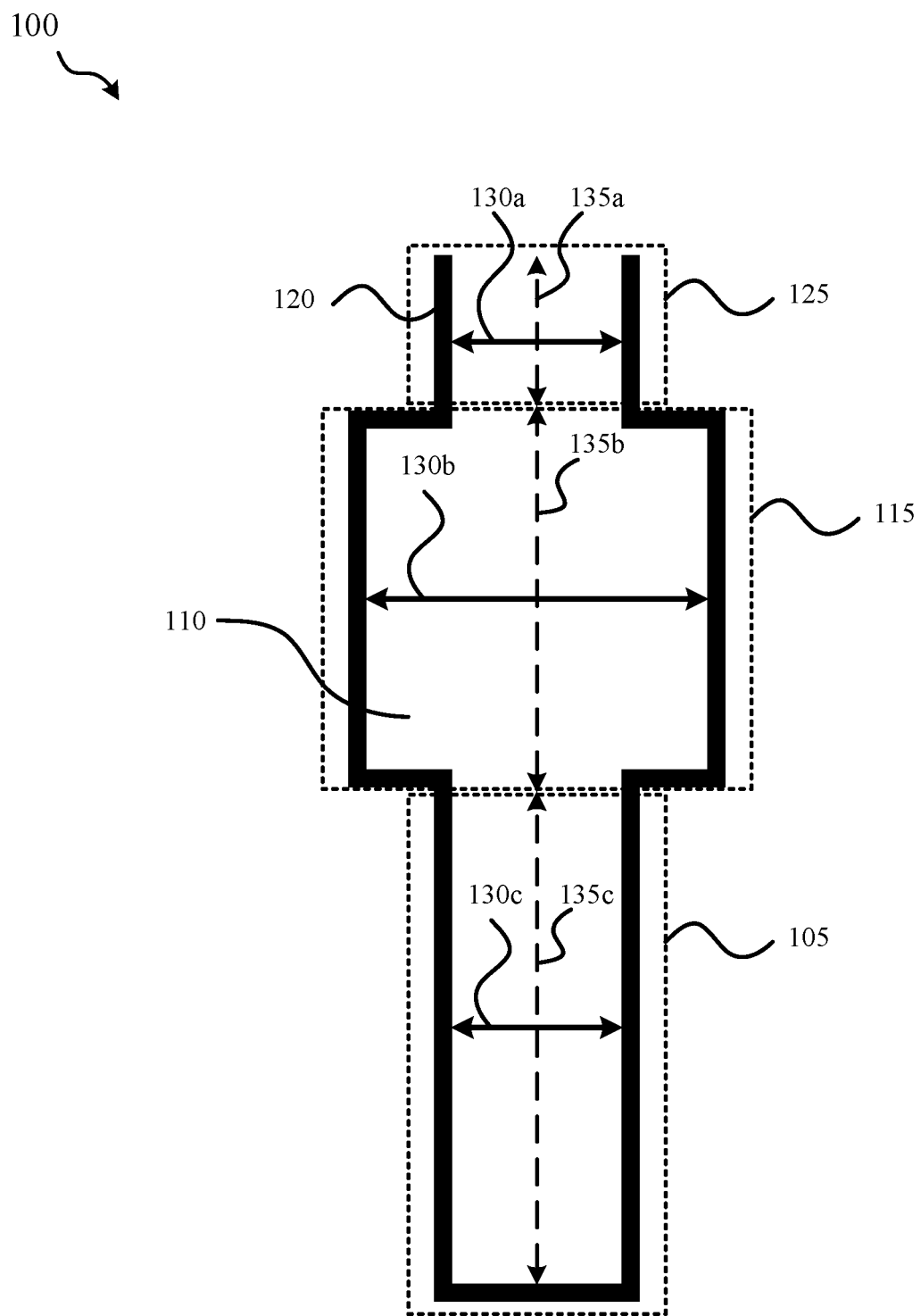
FIG. 1 depicts a schematic diagram of a wire with a locally widened profile, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to wiring structures in integrated circuits and logic devices and, more specifically, to forming wire structures with locally widened profiles to increase uniformity between wires. While the present disclosure is not necessarily limited to such applications, various aspects of the disclosure may be appreciated through a discussion of various examples using this context.

Interconnects (also referred to herein as wires and/or wiring) may connect the various components of semiconductor chips. Because of this, interconnects/wires may be very important to the functioning of the chip and the device itself. Characteristics such as height, width, shape, material, etc. may all affect the function/ability of the wires. Conventional wires have historically been made from various materials including aluminum and copper, with copper wires often being preferred due to their lesser resistance. However, in contemporary semiconductor chips the node size (e.g., the space between adjacent transistors) is comparatively smaller than those of historical designs. This has resulted in the components and wiring becoming increasingly smaller and smaller in order to take up small amounts of space and maximize space usage within the technology/devices.

Further, as contemporary semiconductor chips have decreased in size, they have also become increasingly powerful and functional. Therefore, these chips have a large amount of functions and capabilities in such a small size. The wires/interconnects that are a part of these semiconductor chips and that connect the various components on these chips are also increasing/improving their functionalities in order to continue being effective on the smaller semiconductor chips.

In addition, as wiring has gotten increasingly smaller and narrower, it has become increasingly difficult to have uniformity between the wires being formed. For instance, conventional wires may be formed by patterning a trench into a dielectric and depositing the wire material into the trench using a single step metal fill. This metal fill may result in non-uniform wires, for example, due to line wiggling. Line wiggling may refer to the distortion, movement, and/or undulation of the trench and the metal fill that occurs during/after the metal fill process. For example, when the trenches are initially patterned into a dielectric, they may be patterned in a uniform shape and size, such that the resulting wires would also be a uniform shape and size. During the initial patterning/formation of the trenches, the trenches may be uniform (or at least relatively uniform) in shape and size. However, with the increasingly small size of the wires (and therefore the increasingly smaller size of the corresponding trenches), the stress from the metal is so large that the act of depositing the metal (e.g., the metal fill) tends to distort the trench shape that was patterned into the dielectric. This stress may be stress imparted by the metal on the patterned dielectric as related to the desire towards minimization of surface free energy of the metal. For instance, in equilibrium, the metal atoms on opposite sidewalls will tend to bond to each other if in close proximity. This effect may lead to warping (or wiggling, as referred to herein) of the patterned dielectric underneath. As a result, the metal wires may vary in size due to the dielectric shape being distorted/warped during the fill process. This distortion/warping is referred to as line wiggling.

These small, narrow trenches may also have a high aspect ratio (i.e., large contrast between the depth and width) as the trenches may be much taller/longer than they are wide. Aspect ratio may be the ratio of the depth/height to the width. An object and/or opening having a high aspect ratio may have a large depth/height and a small width (when compared to the height). An object/opening having a low aspect ratio may have a depth/height that has a similar dimension to the width. Therefore, a small, narrow trench may have a high aspect ratio because the depth of the trench may be much larger than its width. High aspect ratio may further contribute to the high stress and resulting line wiggling. For instance, patterned dielectric (e.g., trenches) with a high aspect ratio may be very narrow but deep. This may place the sidewalls of the trench close together (as the trench is narrow), which during the deposition process of the metal fill may lead to the metal atoms on opposite sidewalls being in even closer proximity (as the sidewalls are very close together) which may increase the amount of bonding between the metal atoms and further warp/distort the patterned dielectric underneath.

Because of the high stress and resulting distortion, each formed trench may change shape/dimensions during the metal fill (i.e., line wiggling may occur), which may result in wires that are not uniform and instead vary in shape and/or size. The varying shape and/or size of the wires may include height/depth variability, width variability, critical dimension variability, etc. Critical dimension(s), as referred to herein, are the dimension(s) of the wires that when not met may affect and/or compromise the function and effectiveness of the wire. Therefore, the depth and/or width of the wires may be critical dimensions in some instances. In some instances, critical dimension may refer to the width of the wire as measured at the top surface of the wire. The top surface of the wire may be the portion/surface of the wire that was filled last, that is farthest away from a substrate/component that the wire was formed on, and/or that appears at a top of the wire when looking at a cross-sectional view such as the view depicted in FIGS. 1-15. The variability in shape and/or size of the wires may cause the wires to function differently and/or improperly, which may cause problems for the components that are connected via the wires, the semiconductor chip, and/or the device itself.

To address some of the above issues, the present disclosure provides a wire structure, a system, and a method to form wire structures with locally widened profiles. As discussed above, as semiconductor chips get smaller, the wires/interconnects also get smaller while also desiring to improve the functionality of the wire. One way a wire's functionality may increase is by decreasing the resistance of the wire. As resistance decreases, the amount of current flow through the wire increases, therefore improving the functionality of the wire. The locally widened profile of the wire structure may help improve (e.g., decrease) the resistance of the wires. Further, in some instances, the wires may be formed in a way to help prevent line wiggling and improve the uniformity of the wires.

Increasing thickness/width of a wire may decrease the resistance of the wire as the increased thickness may allow for more electrons to flow through the wire (compared to a thinner wire), which may increase the conductance and decrease the resistance of a wire. For instance, overall wire resistance relates to the wire cross-section area, and a larger wire cross-section may result in a lower/decreased wire resistance. Increasing thickness/width of a wire is one way to increase the cross-section area of the wire. A decreased resistance of a wire may improve the function of the wire as it may allow for improved and/or increased current to flow between components and through the wire(s). Locally widening a portion of a wire may increase the cross-section area of the wire (as a portion of the wire has an increased width), therefore decreasing the resistance of the wire, while not fully increasing the width of the wire. Having a wire with a locally widened profile (as opposed to a wire with an entirely widened profile) may allow for a decreased resistance of the wire (when compared to a thinner wire with no local widening) while also maintaining a small size and taking up less space (when compared to a thicker wire/wire with an entirely widened profile). For example, if the wire had an entirely widened profile, there may need to be increased distance between the wire and other wires and/or components (when compared to a wire with a locally widened portion), as there may need to be enough dielectric between the wire(s)/components in order to maintain the structure of the wire(s) and the semiconductor chip as a whole. When there is a locally widened portion of the wire, there may be enough dielectric between the wire(s) and components—particularly the non-widened portions—that the structure may be maintained without needing to increase the distance between the wire and other wires and/or components. Further, locally widening the wire reduces the risk of shorting from one wire to the next, when compared to a wire with an entirely widened profile, especially at a top surface of the wire. Therefore, as interconnect technology is scaling down to increasingly smaller dimensions, it may be important to maintain a small size of the wires and not simply increase the overall size/profile of the wire in order to decrease the resistance.

In some instances, the wires with locally widened profiles may also be formed in a way that may help improve the uniformity of the wires and reduce, or even prevent, line wiggling when forming the wires. Specifically, the wires may be formed using a multi-step deposition process so that each metal fill/deposition may have a small size and aspect ratio, therefore reducing the stress caused by the metal fill and reducing and/or preventing any distortion of the trenches patterned into the dielectric. This process is further discussed and explained herein. By having wires with a consistent and uniform width and depth, the function of the semiconductor chip and/or overall device may improve (as there is less variability in function due to a variability in size), the scalability of the wires may improve/increase (as the dimensions of the wires are more uniform and the actual dimensions of the wires are more known (as opposed to conventional wires that have variability in size and the actual sizes may not be known)), and metal wire shorts that may have been caused by the variability of the wires may be reduced.

Referring now to FIG. 1 a schematic diagram of a wire 100 with a locally widened profile is depicted, according to some embodiments. Wire 100 may also be referred to herein as wire interconnect 100, as it may be used as an interconnect within a semiconductor chip. As discussed herein, increasing width/thickness of a wire may decrease the resistance of the wire. Locally widening the profile of a wire may decrease the resistance of the wire (compared to a wire that has no locally widened profile) while not fully widening the entire wire, which may be undesirable as semiconductor chips and their corresponding wires/interconnects have been trending smaller and smaller. Wire 100 has a locally widened profile, illustrated in FIG. 1 as width 130*b* of wire 100. The portion of the wire 100 with the locally widened profile is portion 115. Other portions of wire 100 have smaller widths, as shown by widths 130*a* and 130*c*. These portions are portion 105 and portion 125 depicted in FIG. 1. Having smaller portions 105 and 125 of the wire 100 may beneficially keep the overall size and thickness of the wire relatively small. In some instances, widths 130*a* and 130*c* are the same width. In some instances, portion 105 of wire 100 may be referred to as a first portion (and/or section) of wire 100, portion 115 (i.e., the locally widened portion) may be referred to as a second portion of wire 100, and portion 125 may be referred to as a third portion of wire 100.

Portion 115 is above portion 105. Above, as used herein, refers to a portion of a component (for example, wire 100, in this instance), portion of an opening, etc. that was filled after another portion of the component, that is farther away from a connecting component (for example, devices in the substrate to which portion 105 connects), and/or that appears on top of another portion of the component when looking at a cross-sectional view such as the view depicted in FIGS. 1-15. For instance, portion 125 is above portion 115.

FIG. 1 depicts exemplary depths of each portion of the wire, with portion 105 having a depth 135*c*, portion 115 having a depth 135*b*, and portion 125 having a depth 135*a*. In this instance, depths 135*b* and 135*c* may be similar, with depth 135*c* being slightly deeper. In other instances (not depicted), portions 105, 115, and 125 may have other depths. In some instances, discussed further herein, portions 105, 115, and/or 125 may be filled/formed at different times. For example, portion 105 may be formed and filled first, and portions 115 and 125 may be formed together, but at a later time than portion 105. In another example, portions 105, 115, and 125 may all be filled at different times. Separating the formation and fill process (as opposed to having a single fill) may decrease the aspect ratio of each fill, which may then help prevent variability in the size of the wire. For instance, when filling portion 105 of the wire, although the depth 135*c* of this portion may still be greater than the width 130*c*, the depth 135*c* and width 130*c* may be more comparable—and therefore have a lower aspect ratio—than if the entire depth of the wire (with depths 135*a*, 135*b*, and 135*c* put together) were being filled at once. Similarly, the widths 130*b* and 130*a* may be comparable to depths 135*b* and 135*a*, respectively, therefore the aspect ratios of these portions 115 and 125 may also be relatively low, which may help prevent variability and distortion caused by a metal fill.

Wire 100 has a conductive material 110 used as the main conductor for the wire. In some instances, the conductive material 110 may be a material such as ruthenium (Ru), tungsten (W), molybdenum (Mo), rhodium (Rh), cobalt (Co), iridium (Ir), copper (Cu), etc. In some instances, as wires have gotten increasingly smaller (for example, with a BEOL (back-end-of-line) pitch below 30 nanometers (nm)/width critical dimension below 15 nm), materials other than Cu may be used for the conductive material 110, as Cu may have difficulties at such a small size. Therefore, in some instances, the conductive material 110 may be non-Cu materials such as Ru, W, Mo, Rh, Co, Ir, etc. In some instances, line wiggling may become increasingly frequent as pitches get smaller (for example, BEOL pitch below 30 nm/width critical dimensions below 15 nm). The width critical dimension, as referred to herein, may be the width of the wire as measured at the top surface of the wire. For example, for wire 100, the width critical dimension may be width 130*a*, as this is the width of the wire as measured at the top surface of the wire 100. The top surface of the wire 100 may be the highest portion/surface of wire 100 (when looking at the cross-sectional view depicted in FIG. 1) in section 125, in some instances.

In some instances, a wire may include the conductive material 110 and a surrounding dielectric (not depicted, but discussed further herein). In some instances, as depicted in FIG. 1, wire 100 may further include a metal barrier 120 between the conductive material 110 and any surrounding dielectric or other materials. Metal barrier 120 may be a material such as titanium nitride (TiN), tantalum nitride (TaN), niobium nitride (NbN), etc. In some instances, the barrier 120 may help keep the conductive material 110 separated from any surrounding dielectric or other materials. In some instances, if there were no metal barrier 120, the conductive material 110 may diffuse into the dielectric (for example, at high temperatures). For example, conductive materials 110 such as Cu may have properties including high diffusivity and poor adhesion, which may result in the Cu diffusing into surrounding materials (e.g., dielectric). Therefore, a metal barrier, such as metal barrier 120, may be used to separate the conductive material 110 from surrounding materials and/or dielectric and prevent unwanted diffusion. Metal materials such as TiN, TaN, NbN, etc. may be stable materials that are able to have proper adhesion to both the conductive material 110 and, for example, surrounding dielectric, which may help prevent the conductive material 110 from diffusing into its surrounding materials.

As discussed herein, the locally widened section of wire 100 (i.e., portion 115 of the wire 100) may decrease the resistance of wire 100 and improve the functioning of wire 100. However, as also discussed herein, as semiconductor chips have become increasingly smaller (and therefore the corresponding wires/interconnects have also become increasingly smaller), problems such as line wiggling and inconsistency between dimensions of the various wires have occurred. FIGS. 2-15 depict an example method of forming wires (such as wire 100) that may further address these problems.

Figure 2:
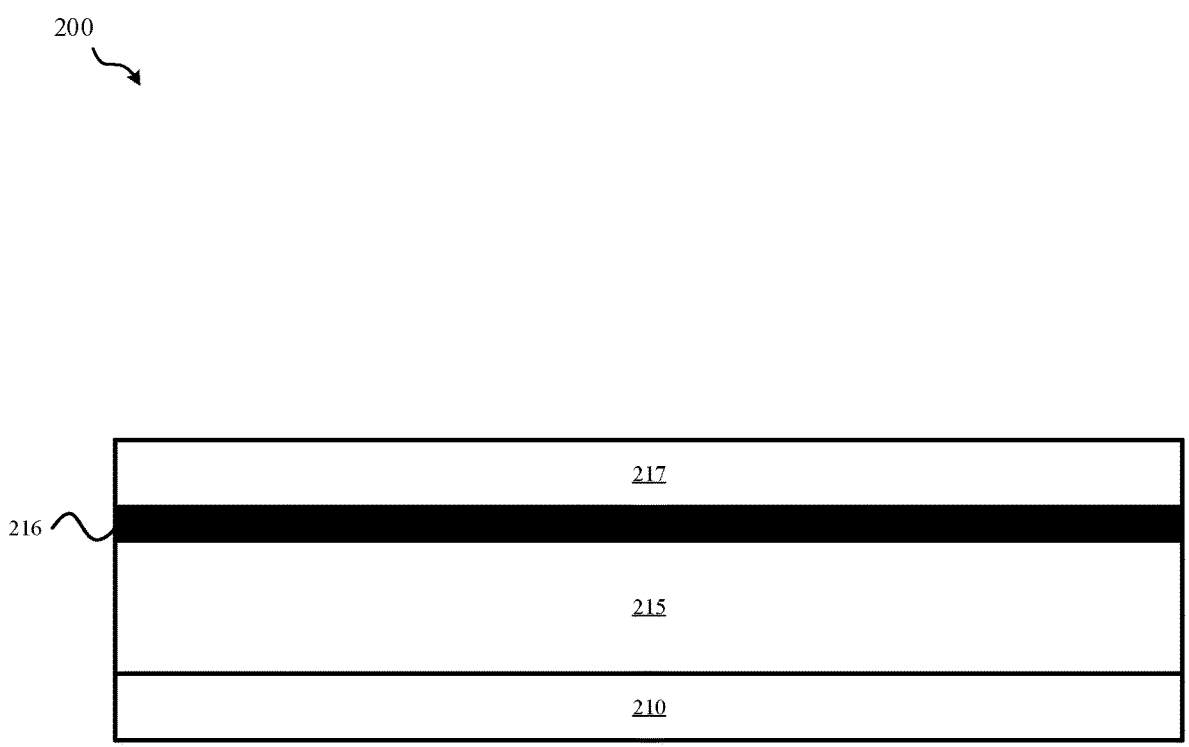
FIG. 2 depicts a schematic diagram of a first intermediate step in a process of forming wire(s) through multi-step deposition, according to some embodiments.

Therefore, referring now to FIG. 2, a schematic diagram of an intermediate step 200 of depositing dielectric and preparing for patterning is depicted, according to some embodiments. Intermediate step 200 may include depositing a dielectric 215 on top of a substrate/wafer 210. Dielectric 215 may be deposited using methods such as atomic layer deposition (ALD), chemical vapor deposition (CVD), laser induced chemical vapor deposition (LCVD), and/or any other applicable deposition technique. In some instances, dielectric 215 may be a low-k dielectric such as SiCOH, parylene, silicon nitride (SiN), silicon dioxide ($SiO_2$), or any other low-k dielectric material.

To help prevent any unwanted removal of dielectric 215 (for example, in later patterning/etching steps), intermediate step 200 includes depositing a hard mask 216 on top of or proximately connected to dielectric 215. The term "proximately connected" may be used herein to describe a connection between two components, specifically components that are directly connected to or touching each other. For example, hard mask 216 may be described as proximately connected to dielectric 215, as they are in direct contact with each other. However, hard mask 216 may not be described as proximately connected to substrate 210, as they are not in direct contact with each other and instead dielectric 215 separates the two. Even though components may not be proximately connected to each other, they still may have an electrical connection and may be described as electrically connected to each other.

Intermediate step 200 also includes the deposition of a material 217 on top of the hard mask 216, with the material 217 being etchable without etching hard mask 216. In some instances, intermediate step 300 (FIG. 3) may utilize lithographic patterning (discussed further herein) as a patterning/etching method that may not disrupt or etch hard mask 216. In these instances, material 217 may be a photoresist material, as a photoresist material is a light sensitive material that can be patterned through lithographic patterning.

Figure 3:
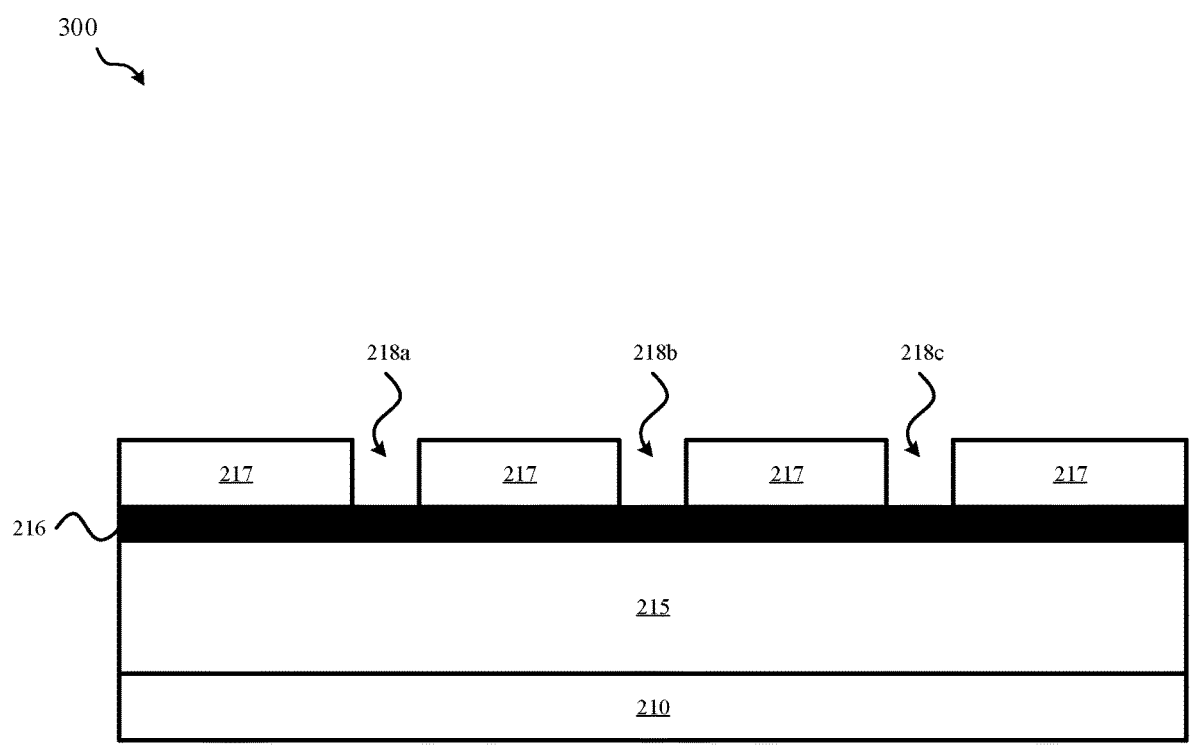
FIG. 3 depicts a schematic diagram of a second intermediate step in a process of forming wire(s) through multi-step deposition, according to some embodiments.

Referring to FIG. 3, a schematic diagram of an intermediate step 300 of patterning openings (218a, 218b, and 218c) in material 217 is depicted, according to some embodiments. In some instances, lithographic patterning may be used to pattern openings 218a, 218b, and 218c (referred to collectively as openings 218) into a photoresist material 217, as lithographic patterning may be effective on the photoresist material 217 without patterning portions of hard mask 216. In other instances, other methods of patterning openings 218 into a material 217 may be utilized. In these instances, material 217 may not be a photoresist material, as the photoresist material may only be needed if lithographic patterning was being utilized. Openings 218 may be the start of the trenches (discussed and depicted further herein) that will later be filled by a metal fill material to form the wires.

Figure 4:
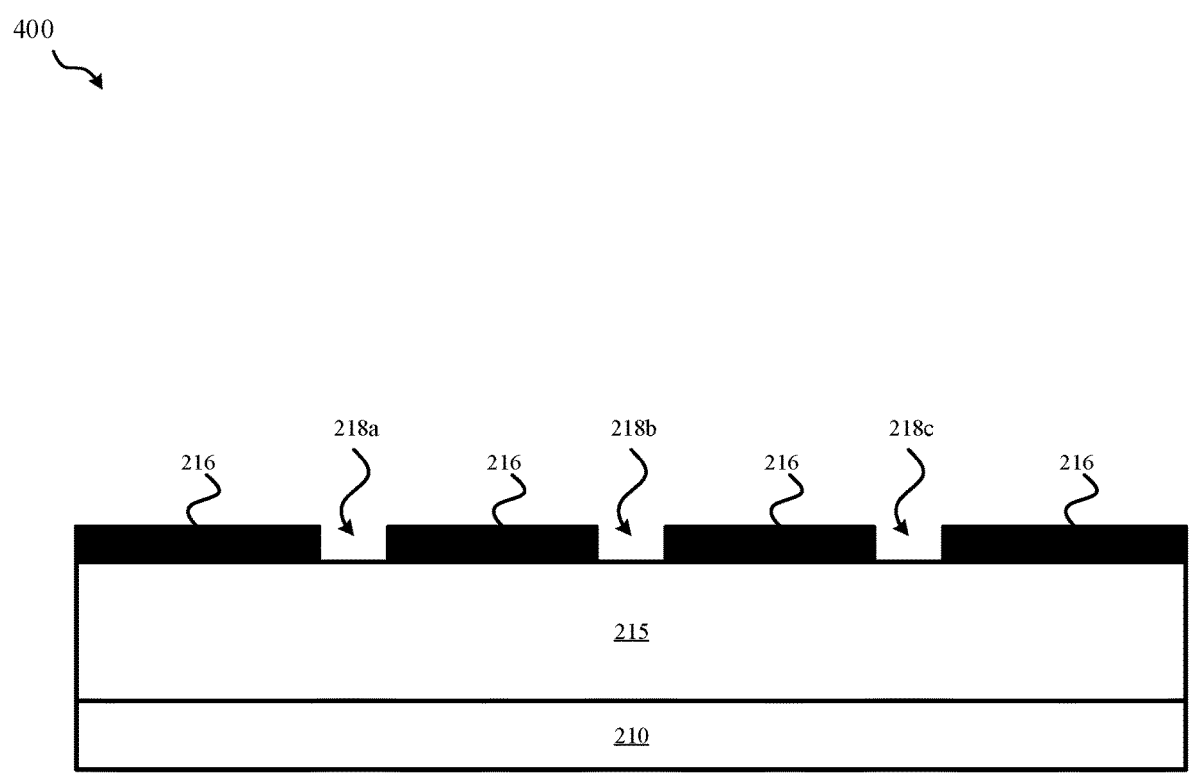
FIG. 4 depicts a schematic diagram of a third intermediate step in a process of forming wire(s) through multi-step deposition, according to some embodiments.

Referring now to FIG. 4, a schematic diagram of an intermediate step 400 of patterning the hard mask 216 is depicted, according to some embodiments. Intermediate step 400 may include patterning/extending the openings 218 created in the photoresist material 217 into the hard mask 216. This way, the hard mask 216 may still protect the majority of the dielectric 215 from unwanted etching, while leaving the portions of dielectric 215 below the openings unprotected. In some instances, dry etching, or any other patterning/etching technique that can etch through selective portions of the hard mask 216, may be used. Once the openings 218 are extended and etched into the hard mask 216, intermediate step 400 may also include (as depicted) removing the material 217, as it may no longer be needed. Material 217 may have been helpful in guiding where to etch the openings 218 into the hard mask 216, however once the openings 218 are etched into the hard mask 216, material 217 may no longer be needed and may be removed.

Figure 5:
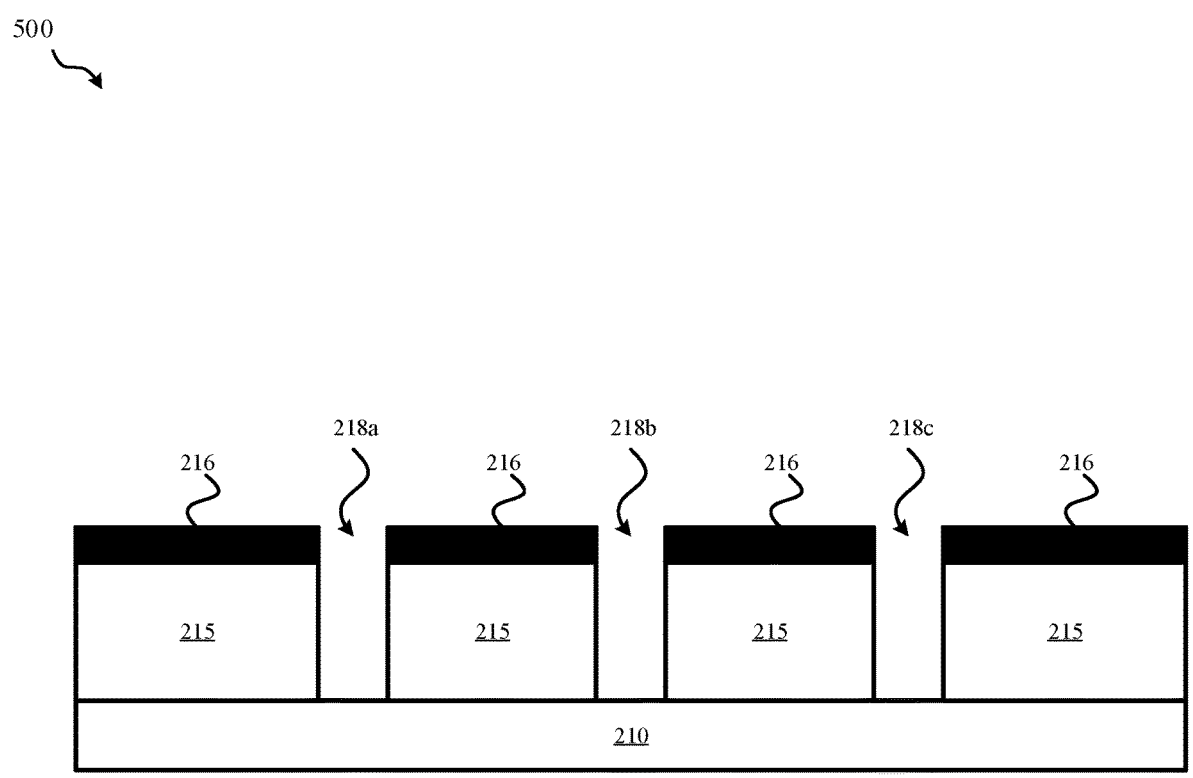
FIG. 5 depicts a schematic diagram of a fourth intermediate step in a process of forming wire(s) through multi-step deposition, according to some embodiments.

Referring to FIG. 5, a schematic diagram of an intermediate step 500 of forming trenches is depicted, according to some embodiments. Specifically, intermediate step 500 includes extending the openings 218 through dielectric 215. This may be done using a dry etch or any other applicable patterning/etching technique. The openings 218 extended through the dielectric 215 may also be referred to herein as trenches 218.

Figure 6:
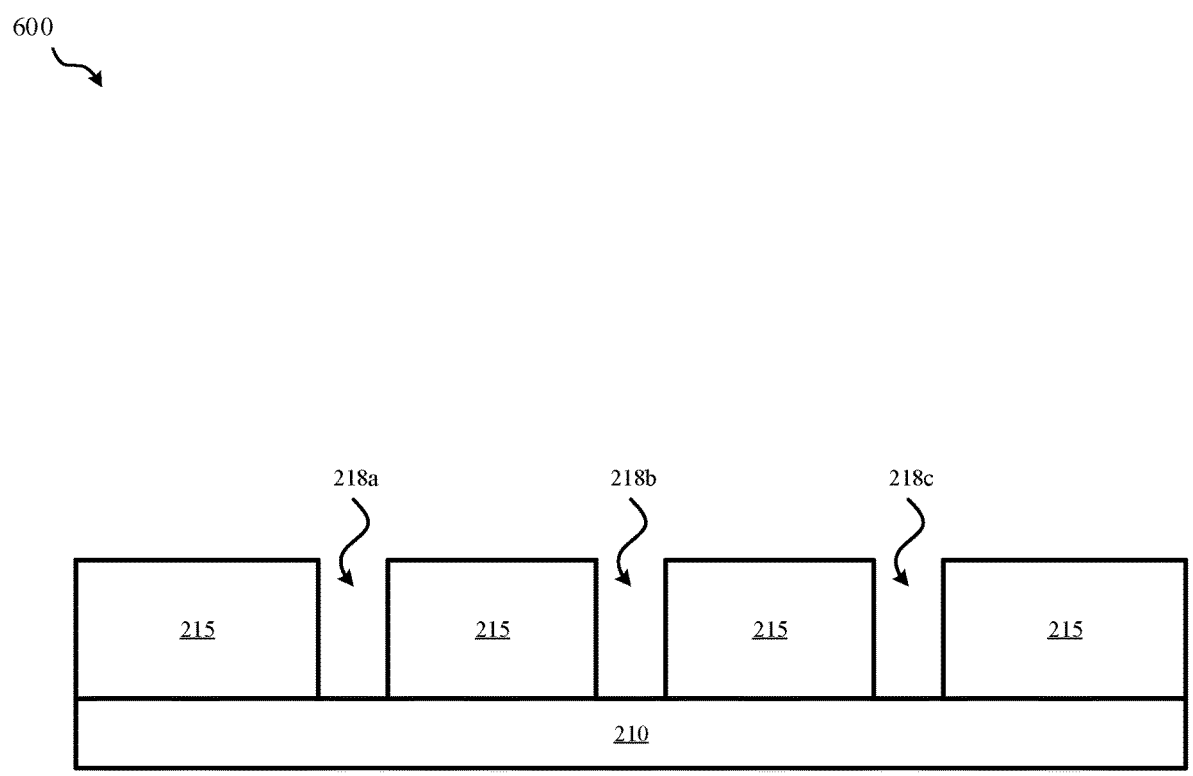
FIG. 6 depicts a schematic diagram of a fifth intermediate step in a process of forming wire(s) through multi-step deposition, according to some embodiments.

Referring to FIG. 6, a schematic diagram of an intermediate step 600 of removing the hard mask 216 is depicted, according to some embodiments. Hard mask 216 was used to protect dielectric 215 from unwanted etching, however now that the etching near dielectric 215 is done, hard mask 216 is no longer needed. Hard mask 216 may be removed using any applicable etching, patterning, or other removal technique.

Figure 7:
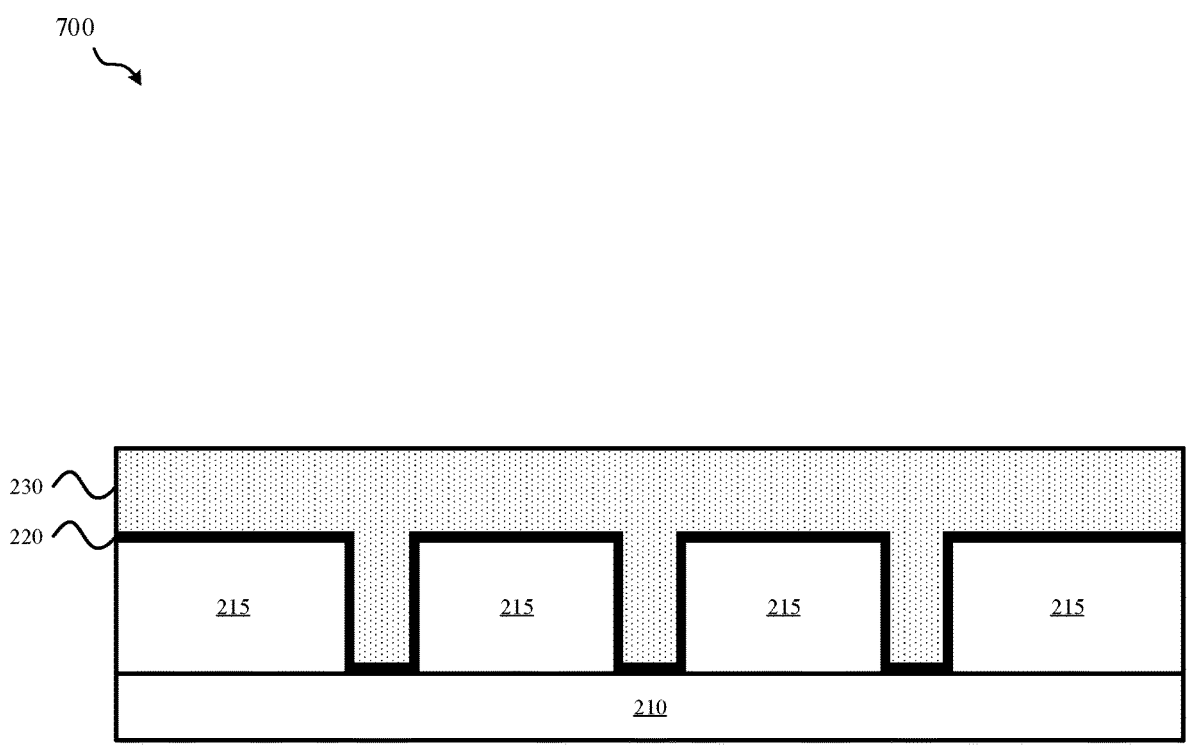
FIG. 7 depicts a schematic diagram of a sixth intermediate step in a process of forming wire(s) through multi-step deposition, according to some embodiments.

Referring to FIG. 7, a schematic diagram of an intermediate step 700 of depositing metal fill is depicted, according to some embodiments. In some embodiments, as depicted in FIG. 7, intermediate step 700 includes depositing a thin barrier 220 on top of the dielectric 215 and in the trenches 218 (FIG. 6). The barrier 220 may help separate the conductive material 230 from the dielectric 215, and may help prevent diffusion of the conductive material 230 into the dielectric 215. In these embodiments, conductive material 230 is deposited on top of barrier 220. Techniques such as atomic layer deposition (ALD), chemical vapor deposition (CVD), physical vapor deposition (PVD), etc. may be used to deposit the conductive material 230. Conductive material 230 may be a material such as Ru, W, Mo, Rh, Co, Ir, Cu, etc. Barrier 220 may be a material such as TiN, TaN, NbN, etc.

In some embodiments, there may not be a barrier 220 and instead the conductive material 230 may be deposited directly on top of dielectric 215 and in the trenches 218 that are depicted in FIG. 6. In these instances, conductive material 230 may be a material that does not have a high risk of diffusing into dielectric 215. Of note, conductive material 230 may be referred to herein as the "metal fill," and the combination of the conductive material 230 and the barrier 220 may also be referred to herein as the metal fill. In other words, the "metal fill" may refer to the metal/conductive materials that were deposited/filled into the trenches 218 (FIG. 6).

Intermediate step 700 is part of a multi-fill process of forming a wire structure. Therefore, the fill process depicted in intermediate step 700 is not the only fill utilized to form the wire(s), in this instance. As discussed further herein, performing a multi-fill process allows for smaller sized fills (such as the fill occurring in intermediate step 700) which helps prevent any line wiggling and/or dimension variation. Instead, the trenches 218 (FIG. 6) that were previously created may stay intact and the conductive material 230 (and barrier 220) may be deposited with the intended shapes and dimensions.

Figure 8:
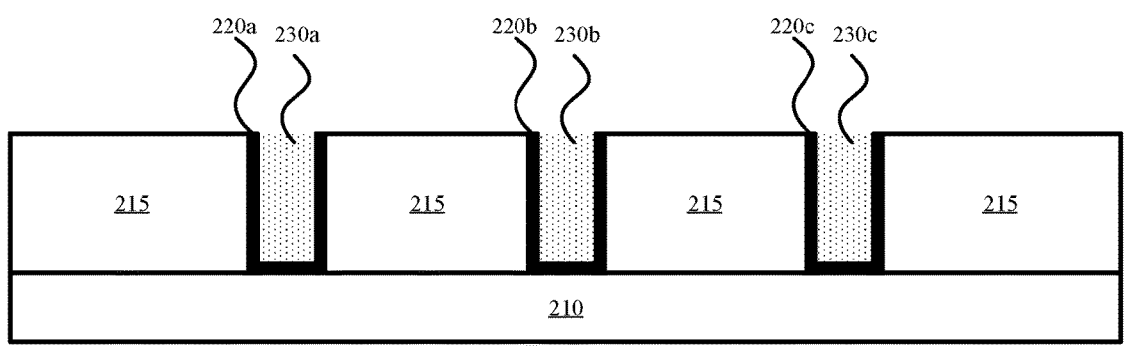
FIG. 8 depicts a schematic diagram of a seventh intermediate step in a process of forming wire(s) through multi-step deposition, according to some embodiments.

Referring now to FIG. 8, a schematic diagram of an intermediate step 800 of removing excess material is depicted, according to some embodiments. In some instances, as depicted in intermediate step 800, the excess material is the material above dielectric 215. The excess material may be removed (and then the remaining material smoothed/polished) through chemical mechanical planarization (CMP), in some instances. After the excess material has been removed, three partially formed wires remain. Conductive material 230*a*, 230*b*, and 230*c* and barrier 220*a*, 220*b*, and 220*c* may be referred to collectively as conductive material(s) 230 and barrier(s) 220, respectively.

Figure 9:
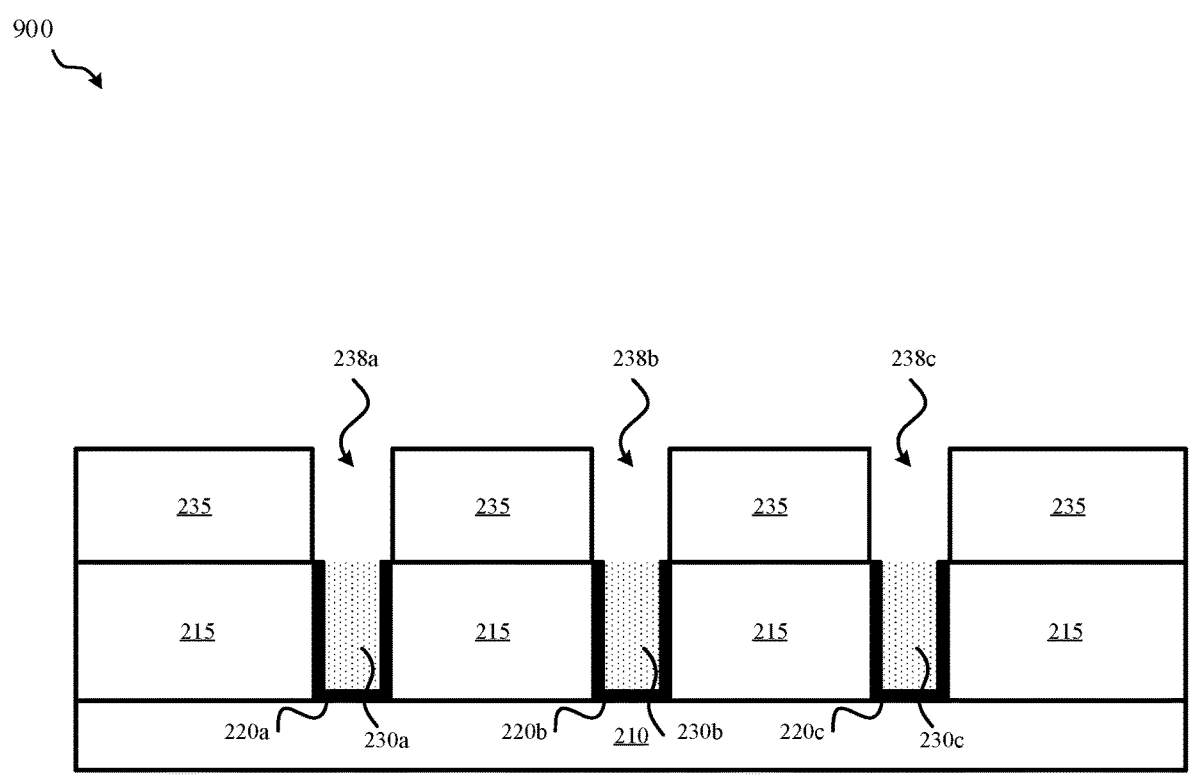
FIG. 9 depicts a schematic diagram of an eighth intermediate step in a process of forming wire(s) through multi-step deposition, according to some embodiments.

Referring to FIG. 9, a schematic diagram of an intermediate step 900 of depositing a dielectric 235 is depicted, according to some embodiments. In some instances, dielectric 235 may be deposited using a selective deposition technique where the dielectric is only deposited in the areas depicted in FIG. 9 (i.e., selectively deposited on top of dielectric 215 but not onto conductive material 230 or barrier 220). In some instances, dielectric 235 may be deposited in a single layer, and then portions of the dielectric 235 that were deposited over conductive material 230 and barrier 220 may be etched/removed. Dielectric 235 may be SiCOH, parylene, silicon nitride (SiN), silicon dioxide (SiO$_2$), or any other low-k dielectric material. In some instances, dielectric 235 is a different dielectric material than dielectric 215. For example, dielectric 215 may be SiCOH and dielectric 235 may be parylene.

After dielectric 235 is deposited (or after excess dielectric is removed, in some instances), openings 238*a*, 238*b*, and 238*c* (referred to collectively as openings 238) result on top of the previously deposited conductive materials 230 and barriers 220.

Figure 10:
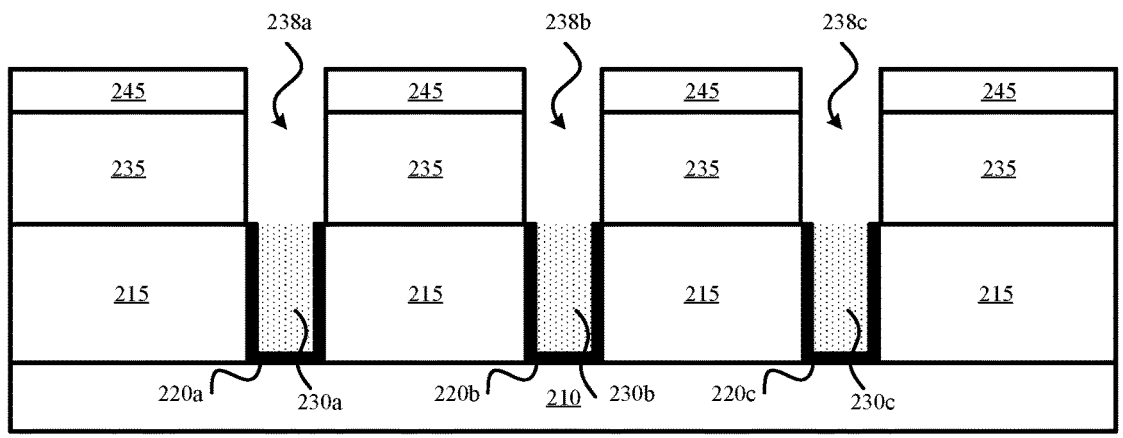
FIG. 10 depicts a schematic diagram of a ninth intermediate step in a process of forming wire(s) through multi-step deposition, according to some embodiments.

Referring to FIG. 10, a schematic diagram of an intermediate step 1000 of depositing another dielectric 245 is depicted, according to some embodiments. In some instances, dielectric 245 is selectively deposited on top of dielectric 235. When selectively depositing dielectric 245, no material may be deposited in the openings 238*a*-238*c* (referred to collectively as openings 238), and the conductive materials 230 and barriers 220 remain uncovered/ unblocked. Dielectric 245 may be SiCOH, parylene, SiN, SiO$_2$, or any other low-k dielectric material. In some instances, dielectric 245, 235, and 215 may all be different materials. In some instances, dielectric 245 may be a different material than dielectric 235, but a same material as dielectric 215.

Figure 11:
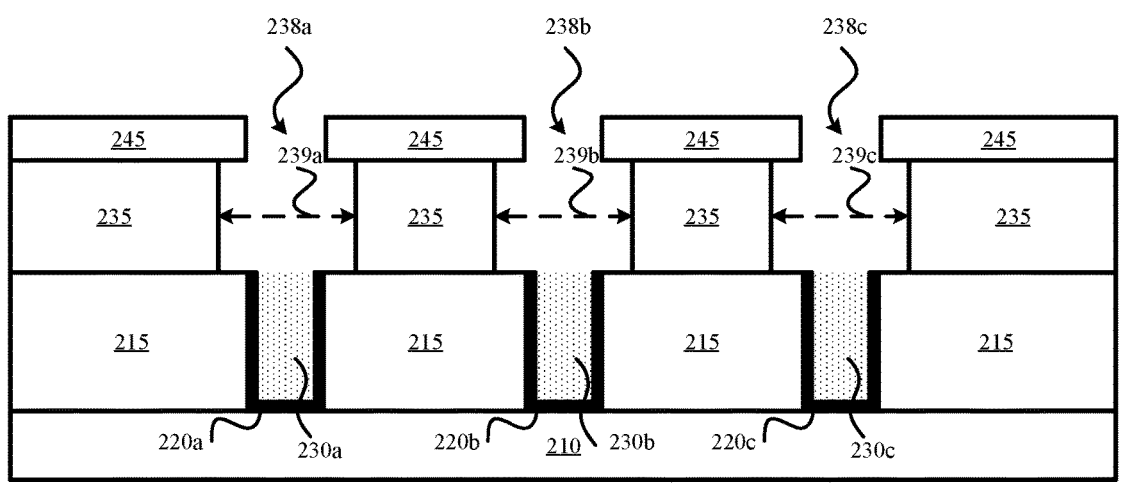
FIG. 11 depicts a schematic diagram of a tenth intermediate step in a process of forming wire(s) through multi-step deposition, according to some embodiments.

Referring to FIG. 11, a schematic diagram of an intermediate step 1100 of locally widening the opening is depicted, according to some embodiments. Specifically, intermediate step 1100 includes performing a selective etch and only etching dielectric 235 (for example, etching side portions of dielectric 235) without etching dielectric 245 or dielectric 215. This way, openings 238 are widened (shown by widths 239*a*, 239*b*, and 239*c*—referred to collectively as widths 239) selectively/locally, without widening the entire opening. In some instances, the selective etching is performed using a selective wet etch/selective wet removal. In selective wet etching, the etchant used may be chosen based on the material of the dielectric 235.

Figure 12:
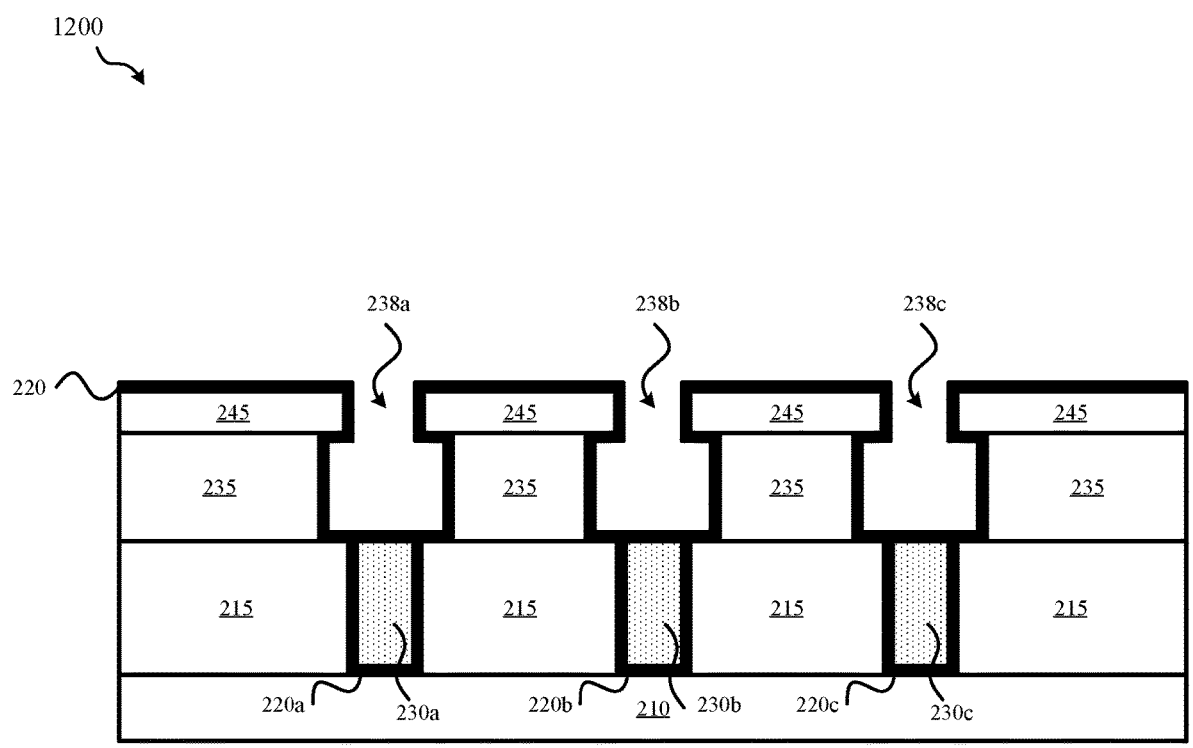
FIG. 12 depicts a schematic diagram of an eleventh intermediate step in a process of forming wire(s) through multi-step deposition, according to some embodiments.

Referring to FIG. 12, a schematic diagram of an intermediate step 1200 of depositing additional barrier 220 is depicted, according to some embodiments. The barrier 220 may be deposited in a thin layer on top of dielectric 245 and within the openings 238. In some instances, barrier 220 is deposited using methods such as atomic layer deposition (ALD), chemical vapor deposition (CVD), laser induced chemical vapor deposition (LCVD), and/or any other applicable deposition technique. Barrier 220 may be a material such as TiN, TaN, NbN, etc.

Figure 13:
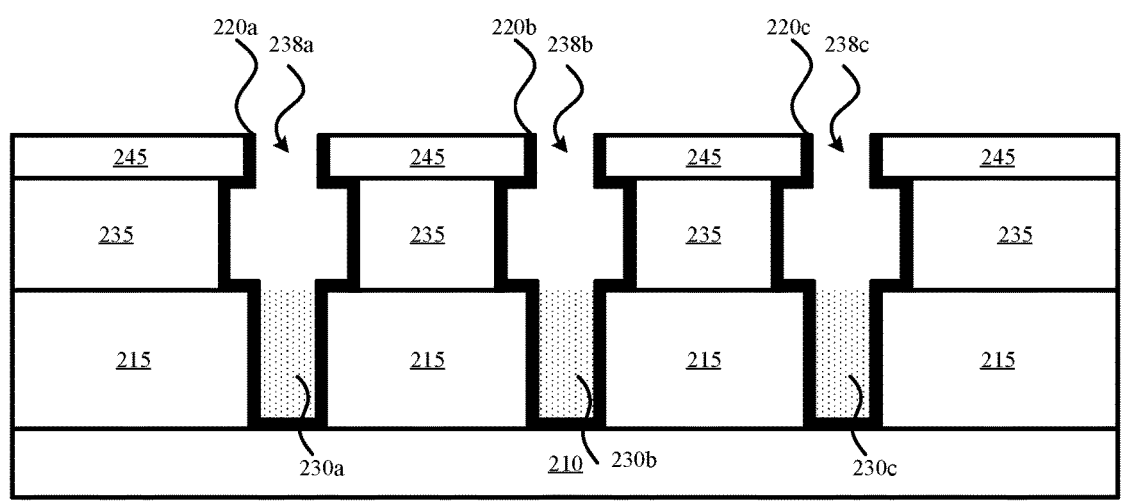
FIG. 13 depicts a schematic diagram of a twelfth intermediate step in a process of forming wire(s) through multi-step deposition, according to some embodiments.

Referring to FIG. 13, a schematic diagram of an intermediate step 1300 of removing excess barrier is depicted, according to some embodiments. The portions of barrier 220 deposited on top of dielectric 245 and on top of the conductive fill 230 may not be needed, as the duty of the barrier 220 is to separate the conductive fill 230 from the dielectrics 215, 235, and 245. After removing the excess barrier, each opening 238*a*, 238*b*, and 238*c* has its own barrier 220*a*, 220*b*, and 220*c*, respectively. As discussed herein, there may be instances where the is no barrier 220. In these instances, the method of forming the wires may go directly from intermediate step 1100 (FIG. 11) to intermediate step 1400 (FIG. 14).

Figure 14:
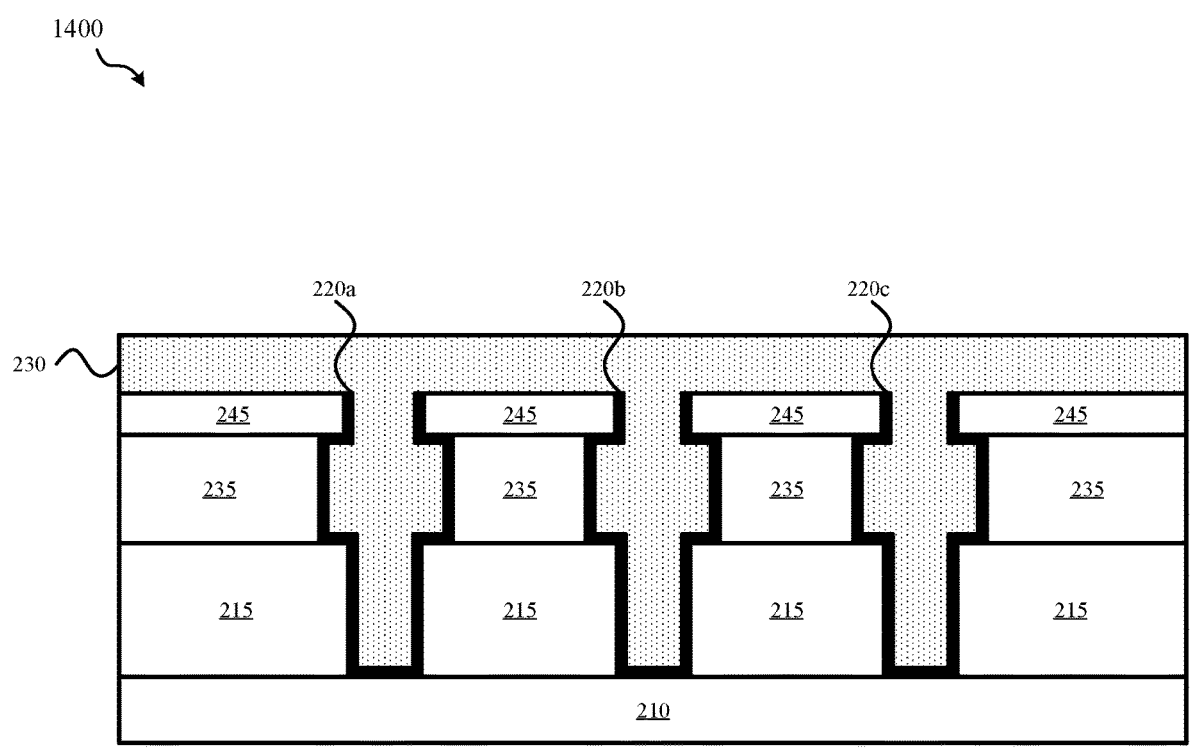
FIG. 14 depicts a schematic diagram of a thirteenth intermediate step in a process of forming wire(s) through multi-step deposition, according to some embodiments.

Referring to FIG. 14, a schematic diagram of an intermediate step 1400 of depositing conductive material 230 is depicted, according to some embodiments. Conductive material 230 may be deposited on top of dielectric 245 and to fill openings 238 (FIG. 13), such that the previously deposited conductive material (depicted in FIG. 7) and the now deposited conductive material combine together to form a single grouping of conductive material 230. In some instances, techniques such as ALD, CVD, PVD, etc. may be used to deposit conductive material 230. In some instances, a superconformal metal fill process can be used, including reflow of metal into the structure, to help ensure that openings 238 are filled and to prevent any gaps or unfilled areas.

Similar to the deposition discussed herein in relation to FIG. 7, the deposition of conductive material 230 in intermediate step 1400 may also be a smaller aspect ratio deposition (as opposed to a single deposition for the entirety of the depth of the wire) because the size of the openings 238 (FIG. 13) may be small and may have a more proportionate width (for instance, both the locally widened width and the narrower top width of openings 238) and depth, when compared to an opening for the entire depth and width of the wire. This may result in openings 238 with smaller aspect ratios, due to the more proportional ratio of width and depth. By depositing a smaller amount of conductive material 230 in a smaller aspect ratio opening (referred to herein as a smaller aspect ratio deposition), negative effects such as line wiggling and dimension variation may be limited and/or prevented as the deposition of the conductive material 230 may cause less stress (due to the lower aspect ratio and the smaller amount of fill/deposition) and therefore less shifting/ distortion of the trenches/openings.

Figure 15:
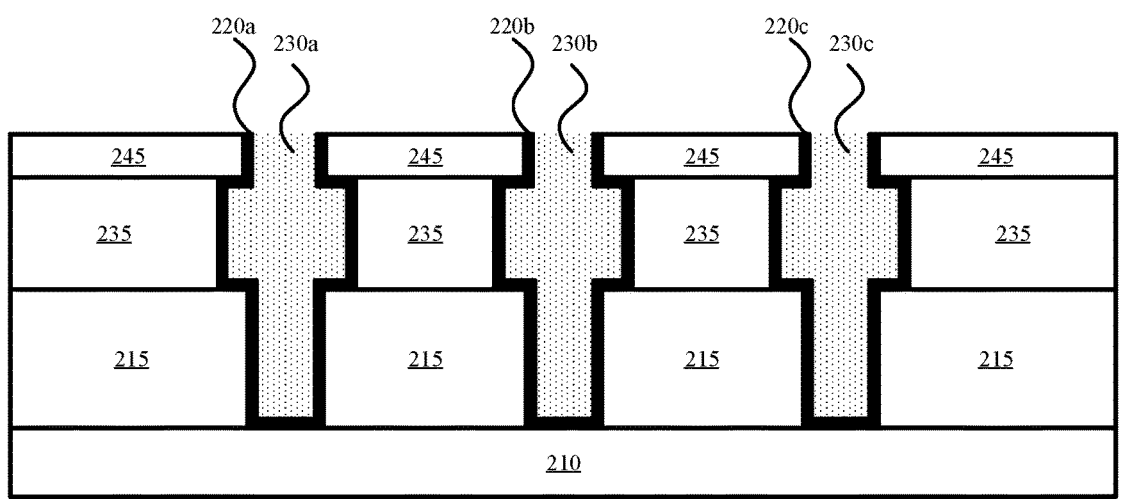
FIG. 15 depicts a schematic diagram of formed metal wires/interconnects with locally widened profiles, according to some embodiments.

Referring to FIG. 15, a schematic diagram of formed metal wire/interconnect structure 1500 with locally widened profiles is depicted, according to some embodiments. To finish forming the metal wires 1500, the excess material may be removed. The excess material may be any material (for example, from conductive material 230) that was above the dielectric 245 and/or the height of the dielectric 245. This material may not be needed, and therefore may be removed in processes such as CMP or other applicable processes.

Wire/interconnect structure 1500 includes three wires—a first wire with barrier 220a and conductive fill 230a, a second wire with barrier 220b and conductive fill 230b, and a third wire with barrier 220c and conductive fill 230c. These wires are surrounded by dielectric 215, 235, and 245. In some instances, not depicted, other components of the semiconductor chip may be connected to the wire(s) and the wires may be used to connect/link the various components. For example, substrate 210 may include one or more devices, and the wires may connect these devices to other devices that would be located at the other end of the wires. These devices may be transistors or other devices, in some instances. In some instances, the wires/interconnects may be used to connect to other metal levels in a multilevel metallization scheme (for example, as in advanced chip technology). Each wire has a locally widened profile in order to help decrease the resistance of the wire and improve the functioning of the wire.

Although the formation process discussed herein and depicted in FIGS. 2-15 is discussed/depicted with three wires, any amount of wires may be formed during this process. Further, as discussed herein, although the wires are depicted with barriers 220a, 220b, and 220c, there may be instances where the conductive material 230a, 230b, and 230c is not at risk of diffusion into the dielectric (215, 235, and 245). In these instances, barrier 220a, 220b, and 220c may not be needed, and therefore may not be a part of the interconnect structure.

Figure 16:
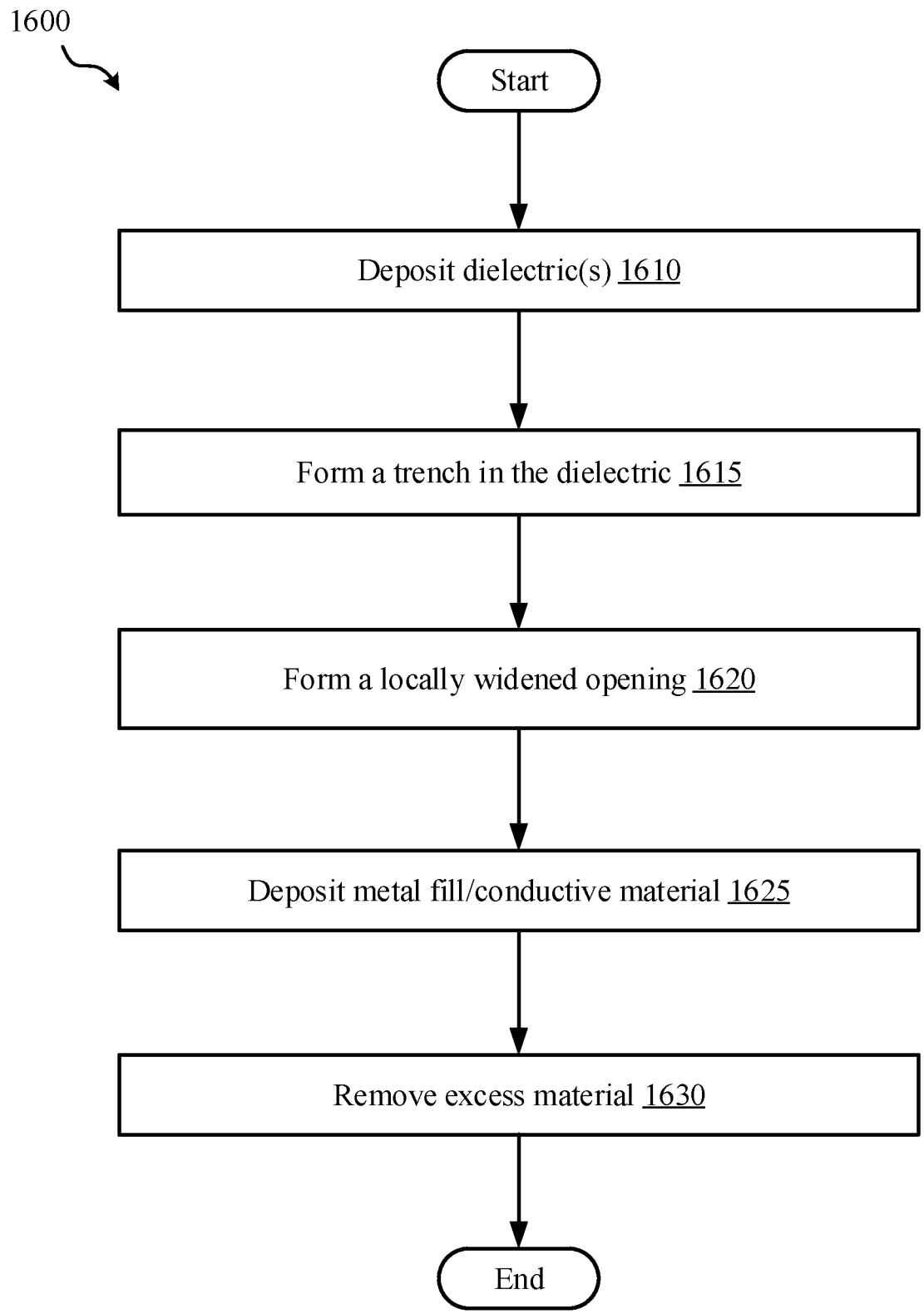
FIG. 16 depicts a flowchart of an exemplary method of forming metal wires/interconnects with locally widened profiles, according to some embodiments.

Referring to FIG. 16 depicts a flowchart of an exemplary method 1600 of forming metal wires/interconnects with locally widened profiles is depicted, according to some embodiments. Method 1600 demonstrates how wire interconnect 100 (FIG. 1) and/or wire structure 1500 (FIG. 15) may be formed using a single-fill process. Method 1600 includes operation 1610 of depositing dielectric(s). In some instances, a single dielectric may be deposited. In other instances, different types of dielectrics may be deposited. For example, a first dielectric material (such as dielectric 215 (FIG. 2) may be deposited on top of a substrate. Then, a second dielectric material may be deposited on top of the first dielectric material (this dielectric material may correspond to dielectric 235 (FIG. 9), in some instances, but may be deposited in a single layer as opposed to the selective deposition with openings 238 discussed in FIG. 9). In this example, a third dielectric material may be deposited on top of the second dielectric material (this dielectric material may correspond to dielectric 245 (FIG. 10), but may be deposited in a single layer as opposed to the selective deposition discussed in FIG. 10). In some instances, when different types of dielectrics are used, the third dielectric material and the first dielectric material may be a same dielectric material, and the second dielectric material may be a different material than the other dielectrics.

Method 1600 proceeds to operation 1615 of forming a trench in the dielectric. In some instances, forming a trench in the dielectric includes patterning and/or etching an opening in the dielectric. In some instances, techniques such as those that utilize hard mask 216 and material 217 (discussed herein and depicted in FIGS. 3-5) may be utilized in order to create opening(s) with a proper width and, in some instances, openings that are proper distances from each other. These opening(s) may then be extended through the dielectric(s) in order to form trench(es). In some instances, a trench may have a non-locally widened width (such as width 130a and/or 130c from FIG. 1) and a depth the entire depth of the wire (such as depths 135a, 135b, and 135c together).

In some instances, when multiple dielectrics are utilized, a trench may be formed in the dielectric prior to the deposition of the second and/or third dielectrics. In these instances, the second and/or third dielectrics may be deposited, for example, using selective deposition. This may result in deposition of the second and third dielectrics above the first dielectric (for example, as depicted in FIG. 10), but with the trench/opening remaining uncovered and instead extended due to the selective deposition.

Method 1600 proceeds to operation 1620 to form a locally widened opening in the trench. As discussed herein, the trench formed in operation 1615 may have a narrow width and no locally widened portion. However, the wire being formed may have a locally widened portion (such as portion 115 (FIG. 1)), therefore, before performing the metal fill process, a locally widened opening may need to be formed in the trench. To form a locally widened opening, a portion of the dielectric is etched/removed using a selective etching process. For example, when multiple dielectric layers/materials are deposited in operation 1610, the opening in the middle dielectric layer/material may be widened (for instance, as depicted in FIG. 11 with locally widened portions 239). In this example, an etching technique that is effective on the second (i.e., middle) dielectric, but not the first or third dielectric(s) (i.e., top and bottom dielectric(s)), may be used. This way, there may not be any unwanted etching outside of the local widening.

Method 1600 proceeds to operation 1625 of depositing a metal fill/conductive material. In some instances, the metal fill includes a barrier and a conductive material. In some instances, only a conductive material may be deposited into the trench without any barrier. This deposition may use similar methods/techniques as intermediate step 700 (FIG. 7) and/or intermediate step 1200 (FIG. 12), but instead of a partial fill, the entire trench and locally widened opening may be filled in a single-fill process. This may result in one or more wires in a similar structure as depicted in FIG. 14.

Method 1600 proceeds to operation 1630 of removing excess material. During the deposition process, excess material, such as conductive fill and barrier material, may be deposited above the dielectric, but this material may not be needed for the wire(s) and may be removed in this step. This may correspond to FIG. 8 and/or FIG. 15, in some instances.

Although method 1600 primarily discusses the forming of a single wire interconnect, this same method may be utilized to concurrently form a plurality of wires (such as depicted in FIG. 15). Further, although method 1600 discusses a single-fill method, these wires with locally widened portions (e.g., portion 115 (FIG. 1)) may also be formed using a multi-fill method (such as what was discussed in FIGS. 2-15).

The present invention may be a system, a method, a computer program product, etc. at any possible technical detail level of integration.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function (s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A wire interconnect, wherein the wire interconnect comprises:
    a first portion of the wire interconnect with a first width and positioned in a first dielectric layer;
    a second portion of the wire interconnect with a second width and positioned in a second dielectric layer, wherein the second width is greater than the first width, and wherein the second portion of the wire interconnect is above the first portion of the wire interconnect; and
    a third portion of the wire interconnect with a third width and positioned in a third dielectric layer, wherein the third width is less than the second width, and wherein the third portion of the wire interconnect is above the second portion of the wire interconnect;
    wherein the second portion has a proximate and interfacially resistive connection to the first portion and wherein the second dielectric layer exhibits etch selectivity relative to the first dielectric layer and to the third dielectric layer.

2. The wire interconnect of claim 1, wherein the third width is the same as the first width.

3. The wire interconnect of claim 1, wherein the wire interconnect has a width critical dimension of less than or equal to 15 nanometers.

4. The wire interconnect of claim 1, wherein the wire interconnect comprises a conductive material, and wherein the conductive material is selected from the group consisting of: Ru, W, Mo, Rh, Co, and Ir.

5. The wire interconnect of claim 4, wherein the wire interconnect further comprises a barrier between the conductive material and one or more dielectrics, and wherein a material of the barrier is selected from the group consisting of: TiN, TaN, and NbN.

6. A wire interconnect structure, the wire interconnect structure comprising:
    a wire interconnect, wherein the wire interconnect comprises:
        a first portion of the wire interconnect with a first width;
        a second portion of the wire interconnect with a second width, wherein the second width is greater than the first width, and wherein the second portion of the wire interconnect is upwards of the first portion of the wire interconnect; and
        a third portion of the wire interconnect with a third width, wherein the third width is less than the second width, and wherein the third portion of the wire interconnect is above the second portion of the wire interconnect; and
    a first dielectric corresponding to the first portion of the wire interconnect, a second dielectric corresponding to the second portion of the wire interconnect, and a third dielectric corresponding to the third portion of the wire interconnect;
    wherein the second portion of the wire interconnect has a proximate and interfacially resistive connection to the first portion of the wire interconnect and wherein the second dielectric exhibits etch selectivity relative to the first dielectric and the third dielectric.

7. The wire interconnect structure of claim 6,
    wherein the first dielectric surrounds one or more outer portions of the first portion of the wire interconnect;
    wherein the second dielectric surrounds one or more outer portions of the second portion of the wire interconnect; and
    wherein the third dielectric surrounds one or more outer portions of the third portion of the wire interconnect.

8. The wire interconnect structure of claim 7, wherein the first dielectric, the second dielectric, and the third dielectric are selected from a group consisting of: SiCOH, parylene, SiN, and $SiO_2$.

9. The wire interconnect structure of claim 7, wherein the second dielectric comprises a different material than the first dielectric and the third dielectric.

10. The wire interconnect structure of claim 6, wherein the wire interconnect structure comprises a plurality of wire interconnects.

11. The wire interconnect structure of claim 6, wherein the third width is the same as the first width.

12. The wire interconnect structure of claim 6, wherein the wire interconnect has a width critical dimension less than or equal to 15 nanometers.

13. The wire interconnect structure of claim 6, wherein the wire interconnect comprises a conductive material, and wherein the conductive material is selected from the group consisting of: Ru, W, Mo, Rh, Co, and Ir.

14. The wire interconnect structure of claim 13, wherein the wire interconnect further comprises a barrier between the conductive material and one or more of the first dielectric, the second dielectric, or the third dielectric, and wherein a material of the barrier is selected from the group consisting of: TiN, TaN, and NbN.

15. A wire interconnect structure comprising:
   a bottom portion positioned in a bottom dielectric, the bottom portion having a first width and composed of a first metal fill;
   a middle portion disposed above the bottom portion and positioned in a middle dielectric, the middle portion having a second width larger than the first width; and
   a top portion disposed above the middle portion and positioned in a top dielectric, the top portion having a third width less than the second width;
   wherein the middle portion and the top portion are collectively composed of a second metal fill that has a proximate and interfacially resistive connection to the first metal fill; and
   wherein the middle dielectric exhibits etch selectivity relative to the bottom dielectric and to the top dielectric.

16. The wire interconnect structure of claim 15,
   wherein the bottom dielectric laterally surrounds the bottom portion;
   wherein the middle dielectric laterally surrounds the middle portion; and
   wherein the top dielectric laterally surrounds the top portion.

17. The wire interconnect structure of claim 16, wherein the bottom dielectric, the middle dielectric, and the top dielectric are selected from a group consisting of: SiCOH, parylene, SiN, and $SiO_2$.

18. The wire interconnect structure of claim 16, wherein the middle dielectric comprises a different dielectric material than the top dielectric and the bottom dielectric.

19. The wire interconnect structure of claim 15, wherein the third width is substantially equal to the first width.

* * * * *